US012791620B2

(12) United States Patent
Kitamura et al.

(10) Patent No.: US 12,791,620 B2
(45) Date of Patent: Nov. 10, 2026

(54) IMPEDANCE MEASURING DEVICE

(71) Applicant: HIOKI E.E. CORPORATION, Nagano (JP)

(72) Inventors: Naoya Kitamura, Nagano (JP); Ryohei Yoshihara, Nagano (JP); Kazuaki Haneda, Nagano (JP)

(73) Assignee: HIOKI E.E. CORPORATION, Nagano (JP)

( * ) Notice: Subject to any disclaimer, the term of this patent is extended or adjusted under 35 U.S.C. 154(b) by 311 days.

(21) Appl. No.: 18/684,729

(22) PCT Filed: Aug. 8, 2022

(86) PCT No.: PCT/JP2022/030277
§ 371 (c)(1),
(2) Date: Jul. 23, 2024

(87) PCT Pub. No.: WO2023/026839
PCT Pub. Date: Mar. 2, 2023

(65) Prior Publication Data

US 2025/0334640 A1 Oct. 30, 2025

(30) Foreign Application Priority Data

Aug. 26, 2021 (JP) ................................ 2021-138307

(51) Int. Cl.
*G01R 31/389* (2019.01)
*G01R 31/3835* (2019.01)

(52) U.S. Cl.
CPC ....... *G01R 31/389* (2019.01); *G01R 31/3835* (2019.01)

(58) Field of Classification Search
CPC .. G01R 31/389; G01R 31/3835; G01R 27/02; G01R 31/54
See application file for complete search history.

(56) References Cited

U.S. PATENT DOCUMENTS 6,255,904 B1 7/2001 Capodivacca et al.
2015/0102672 A1* 4/2015 Matsumoto ............ H02M 1/08 307/31

FOREIGN PATENT DOCUMENTS

EP 3 879 279 A1 9/2021
JP S64-054423 U 4/1989
(Continued)

OTHER PUBLICATIONS

EESR in the corresponding EP application No. 22861129.9 Aug. 14, 2025.
(Continued)

*Primary Examiner* — Feba Pothen
(74) *Attorney, Agent, or Firm* — Chrisman Gallo Tochtrop LLC

(57) ABSTRACT

To provide an impedance measuring device that allows charging of a coupling capacitor and detection of disconnection in a short time. The above object can be accomplished by an impedance measuring device including: a measurement unit that measures a voltage, generated between contact terminals that respectively contact both terminals of a measurement target object by an alternating current supplied to the measurement target object, and determines an internal impedance of the measurement target object; a current source for disconnection detection that supplies an alternating current for disconnection detection to a current path between the measurement unit and the measurement target object via a coupling capacitor; and a charging acceleration unit connected between the coupling capacitor and the current source for disconnection detection to charge the coupling capacitor when the voltage between both the terminals of the current source for disconnection detection-exceeds a prescribed voltage range.

4 Claims, 4 Drawing Sheets

(56) References Cited

FOREIGN PATENT DOCUMENTS

| | | | | | |
|---|---|---|---|---|---|
| JP | H06-130120 | A | | 5/1994 | |
| JP | H08-153157 | A | | 6/1996 | |
| JP | 2006322821 | A | | 11/2006 | |
| JP | 2006343108 | A | * | 12/2006 | |
| JP | 4695920 | B2 | | 6/2011 | |
| JP | 4735250 | B2 | | 7/2011 | |
| JP | 4913458 | B2 | | 4/2012 | |
| JP | 2020-076600 | A | | 5/2020 | |
| WO | WO-2020095471 | A1 | * | 5/2020 | ............. G01R 27/08 |

OTHER PUBLICATIONS

International Search Report for corresponding International Application No. PCT/JP2022/030277 mailed Sep. 20, 2022.

Written Opinion for corresponding International Application No. PCT/JP2022/030277 dated Sep. 20, 2022 and English translation.

* cited by examiner

IMPEDANCE MEASURING DEVICE

CROSS-REFERENCE TO RELATED APPLICATIONS

This application is a national stage entry of International Application No. PCT/JP2022/030277 filed on Aug. 8, 2022, which claims the benefit of priority to Japanese Application No. JP2021-138307, filed Aug. 26, 2021, the entire disclosures of which are hereby incorporated herein by reference.

TECHNICAL FIELD

The present invention relates to impedance measuring devices, and to a four-terminal impedance measuring device having a disconnection detection function.

BACKGROUND ART

There is a four-terminal impedance measuring device as a device to measure an internal impedance of a measurement target object. FIG. 4 shows a conventional example of a typical impedance measuring device 100 described in Patent Literature 1. The impedance measuring device 100 supplies alternating current to a measurement target object 130 from a current source for measurement 110, measures in a measurement unit 120 voltage generated between both terminals of the measurement target object 130 by the alternating current, and determines an internal impedance of the measurement target object 130 based on the current supplied to the measurement target object 130 and the voltage measured between both the terminals.

To accurately measure the internal impedance, the measurement target object 130 needs to be in secure contact with contact terminals Hc, Lc, Hp, and Lp, though there are cases where the contact terminals are not in contact during probing or the contact terminals are removed from the measurement target object 130 during measurement, which causes disconnection. Accordingly, the impedance measuring device 100 detects disconnection of a current path 101 between the measurement unit 120 and the measurement target object 130 by supplying a current for disconnection detection from a current source for disconnection detection 141 and measuring in the measurement unit 120 the voltage generated between the contact terminals Hp and Lp by the current for disconnection detection. Since the disconnection detection is performed before, after, or during the impedance measurement, it is necessary to perform detection in a short time.

DOCUMENT LIST

Patent Literature

Patent Literature 1: Japanese Patent No. 4695920

SUMMARY OF INVENTION

Technical Problem

In an impedance measuring device, such as a battery tester, that measures measurement target objects including a direct-current voltage source, coupling capacitors are respectively inserted between a measurement target object and a current source for measurement, between the measurement target object and a measurement unit, and between the measurement target object and a current source for disconnection detection in order to cancel direct-current voltage generated in the measurement target object. In order to reduce capacitive impedance of the coupling capacitors, it is necessary to increase the capacitance. On the other hand, the current source for disconnection detection does not function normally unless the voltage between both the terminals is within a compliance voltage range, and therefore it is not possible to supply normal current for disconnection detection and perform detection of disconnection unless the coupling capacitors are fully charged. However, as the capacitance of the coupling capacitors increases, the charging time also increases. Since the time required for supplying a normal current for disconnection detection (that is, the response time of a disconnection detection unit) is generated every time disconnection is detected, there is a problem that the total time for impedance measurement, including disconnection detection, becomes longer.

The present invention has been made in view of the above-stated problem, and an object of the present invention is to allow charging of a coupling capacitor and detection of disconnection in a short time.

Solution to Problem

The above problem can be solved by an impedance measuring device including: a measurement unit that measures a voltage, generated between contact terminals that respectively contact both terminals of a measurement target object by an alternating current supplied to the measurement target object, and determines an internal impedance of the measurement target object; a current source for disconnection detection that supplies an alternating current for disconnection detection to a current path between the measurement unit and the measurement target object via a coupling capacitor; and a charging acceleration unit connected between the coupling capacitor and the current source for disconnection detection to charge the coupling capacitor when the voltage between both the terminals of the current source for disconnection detection exceeds a prescribed voltage range.

Specifically, the charging acceleration unit that supplies charging current for the coupling capacitor is provided between the coupling capacitor and the current source for disconnection detection, and the charging acceleration unit is operated when the voltage between the contact terminals that contact both the terminals of the current source for disconnection detection exceeds the prescribed voltage range, so that the coupling capacitor can be charged and disconnection can be detected in a short time.

Here, it is desirable that the prescribed voltage range is narrower than a compliance voltage of the current source for disconnection detection. The current source for disconnection detection can supply normal current for disconnection detection when the voltage between both the terminals is within the compliance voltage range. When the coupling capacitor is charged so that the voltage range of the voltage between both the terminals of the current source for disconnection detection is within the voltage range of the compliance voltage, it becomes possible to detect disconnection in a short time.

It is also desirable that the charging acceleration unit has hysteresis characteristics. It becomes possible to prevent the charging acceleration unit from restarting due to voltage fluctuations caused by the alternating current for disconnection detection and to detect disconnection in a short time.

In addition, it is desirable that the charging acceleration unit includes a hysteresis comparator for a positive power source and a hysteresis comparator for a negative power source. Such a configuration makes it possible to support both the power sources, and makes it possible to charge the coupling capacitor and detect disconnection in a short time, regardless of the polarity of the direct-current voltage of the measurement target object.

Effects of Invention

According to the impedance measuring device according to the present invention, it becomes possible to charge the coupling capacitor and to detect disconnection in a short time.

DESCRIPTION OF EMBODIMENTS

Figure 1:
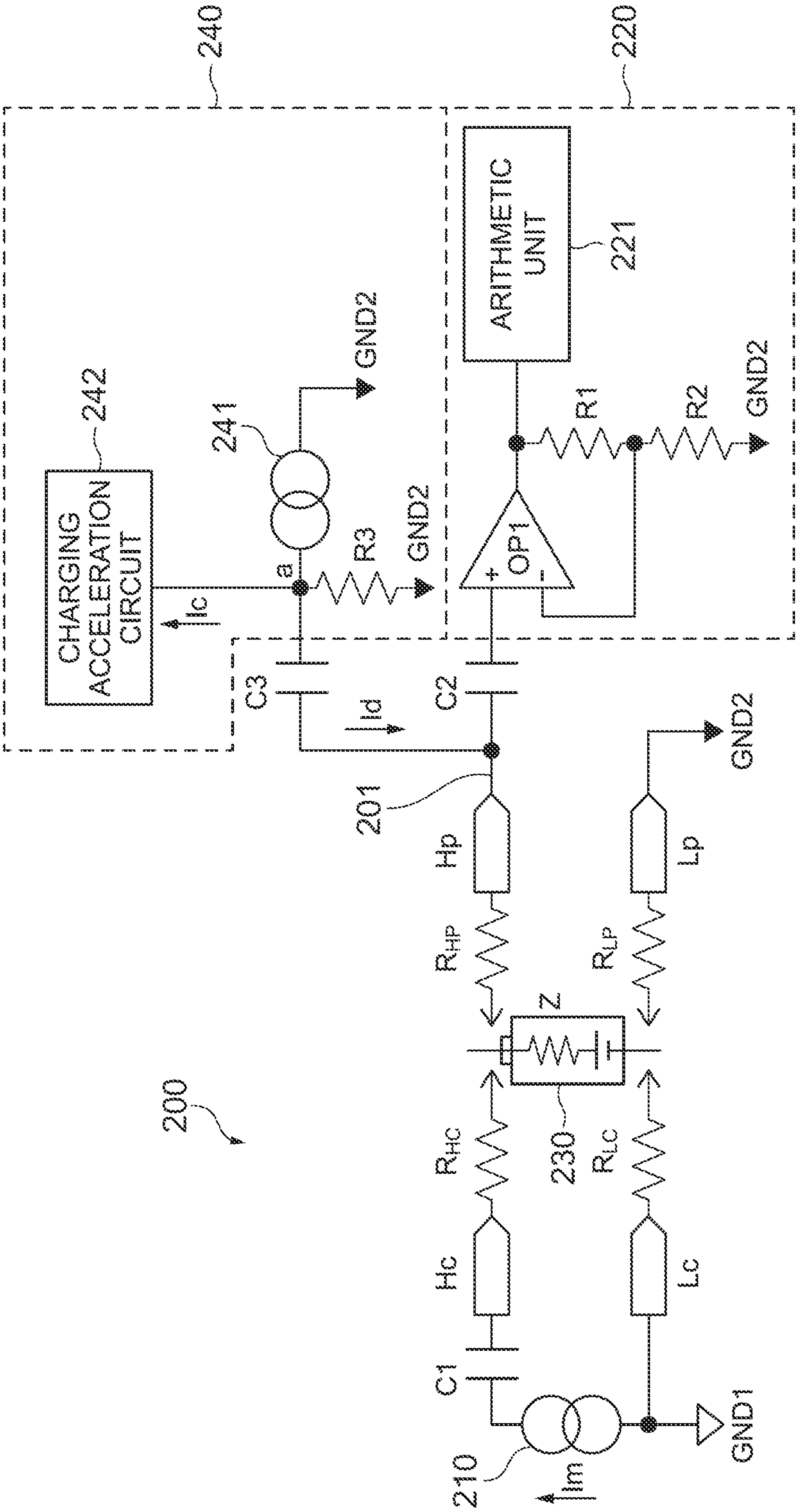
FIG. 1 A configuration diagram of an impedance measuring device according to an embodiment of the present invention in a state of being connected to a measurement target object.

An embodiment of the present invention will be described below with reference to the drawings. FIG. 1 is a configuration diagram of a battery tester 200, as an example of the impedance measuring device according to an embodiment of the present invention, in a state of being connected to a battery 230 that is a measurement target object.

The battery tester 200 is a device that supplies an alternating current Im for measurement to the battery 230 from a current source for measurement 210, measures in a measurement unit 220 a voltage Vm generated between contact terminals Hp and Lp that respectively contact both terminals of the battery 230 by the alternating current Im, and measures an internal impedance Z of the battery 230 based on the current Im supplied to the battery 230 and the measured voltage Vm. In order to detect disconnection of a current path 201 between the measurement unit 220 and the battery 230, the battery tester 200 supplies an alternating current Id for disconnection detection to the current path 201 between the measurement unit 220 and the battery 230 from a current supply unit for disconnection detection 240 via a coupling capacitor C3, and measures in the measurement unit 220 a voltage Vd, generated between the contact terminals Hp and Lp that respectively contact both terminals of the battery 230 by the alternating current Id for disconnection detection, to detect disconnection of the current path 201.

As shown in FIG. 1, the battery tester 200 includes four contact terminals (high voltage-side source terminal Hc, low voltage-side source terminal Lc, high voltage-side sense terminal Hp, and low voltage-side sense terminal Lp). The high voltage-side source terminal Hc and the high voltage-side sense terminal Hp are connected to a high voltage side of the battery 230. The low voltage-side source terminal Lc and the low voltage-side sense terminal Lp are connected to a low voltage side of the battery 230. $R_{Hc}$, $R_{Lc}$, $R_{Hp}$, and $R_{Lp}$ designate contact resistance of the high voltage-side source terminal Hc, the low voltage-side source terminal Lc, the high voltage-side sense terminal Hp, and the low voltage-side sense terminal Lp with respect to the battery 230, respectively.

The high voltage-side source terminal Hc is connected to one end of the current source for measurement 210 via a coupling capacitor C1. Another end of the current source for measurement 210 and the low voltage-side source terminal Lc are connected to a ground GND1 that is a source-side reference potential. On the other hand, the high voltage-side sense terminal Hp is connected to the measurement unit 220 via a coupling capacitor C2 and to the current supply unit for disconnection detection 240 via the coupling capacitor C3. The low voltage-side sense terminal Lp is connected to a ground GND2 that is a sense-side reference potential. The reference potential of component members disposed on the sense side, such as the measurement unit 220 and the current supply unit for disconnection detection 240, is also the ground GND2. The ground GND1 that is the reference potential on the source side and the ground GND2 that is the reference potential on the sense side are electrically separated.

A signal input into the measurement unit 220 via the coupling capacitor C2 is amplified by a non-inverting amplifier circuit in an operational amplifier OP1 and input into an arithmetic unit 221. A non-inverting input terminal of the operational amplifier OP1 is connected to an input of the measurement unit 220, an inverting terminal of the operational amplifier OP1 is connected to one end of a resistor R1 and one end of a resistor R2, and an output terminal of the operational amplifier OP1 is connected to another end of the resistor R1 and the arithmetic unit 221. Another end of the resistor R2 is connected to the ground GND2.

The arithmetic unit 221 includes two lock-in amplifiers, and, by performing synchronization detection at the frequencies of the respective alternating currents supplied from the current source for measurement 210 and the current supply unit for disconnection detection 240, measures the voltage Vm generated between the contact terminals Hp and Lp that respectively contact both the terminals of the battery 230 by the alternating current Im for measurement, and the voltage Vd generated between the contact terminals Hp and Lp that respectively contact both the terminals of the battery 230 by the alternating current Id for disconnection detection. Also, based on the alternating current Im for measurement and the voltage Vm, the internal impedance Z of the battery 230 is calculated. By comparing the voltage Vd with a reference value, disconnection of the current path 201 between the measurement unit 220 and the battery 230 is detected.

The current supply unit for disconnection detection 240 includes a current source for disconnection detection 241, a charging acceleration unit 242, and a resistor R3, which are connected to the input in parallel to each other. The current source for disconnection detection 241 is a current source that supplies the alternating current Id for disconnection detection, the alternating current Id having a frequency different from the frequency of the alternating current Im for measurement. The alternating current Id for disconnection detection is supplied to the current path 201 between the measurement unit 220 and the battery 230 via the coupling capacitor C3. In order for the current source for disconnection detection 241 to function normally, the voltage between both the terminals of the current source for disconnection detection 241 needs to be within the compliance voltage range. However, an absolute value of the voltage between both the terminals of the battery 230 is generally larger than the absolute value of the compliance voltage. It is necessary, therefore, to charge the coupling capacitor C3 so that the voltage between both the terminals of the current source for disconnection detection 241 is within the compliance voltage range before supplying the current Id for disconnection detection.

One end of the resistor R3 is connected to the coupling capacitor C3 and another end of the resistor R3 is connected the ground GND2. Therefore, the current Im for measurement is distributed to the battery 230 and the resistor R3. When the resistor R3 is small, the amount of inflow to the resistor R3 increases, and this causes a measurement error. Accordingly, it is desirable that the resistor R3 is large. Since it is desirable that the impedance of the coupling capacitor C3 is small, the capacitance is desirably large. On the other hand, the charging time of the coupling capacitor C3 is proportional to a time constant of the resistor R3 and the coupling capacitor C3 when the charging acceleration unit 242 is not present. For example, when the resistor R3 is 1 MΩ, and the capacitance of the coupling capacitor C3 is 100 nF, the time constant is 100 ms (=1 MΩ×100 nF). It requires time, depending on the time constant, before charging is completed and normal current for disconnection detection can be supplied. Accordingly, the charging acceleration unit 242 monitors the voltage between both the terminals of the current source for disconnection detection 241, that is, the voltage Va at a point a, and when the voltage Va exceeds a prescribed voltage range, direct current is supplied from the charging acceleration unit 242 to accelerate the charging of the coupling capacitor C3, so as to shorten the time until disconnection detection becomes possible.

Figure 2:
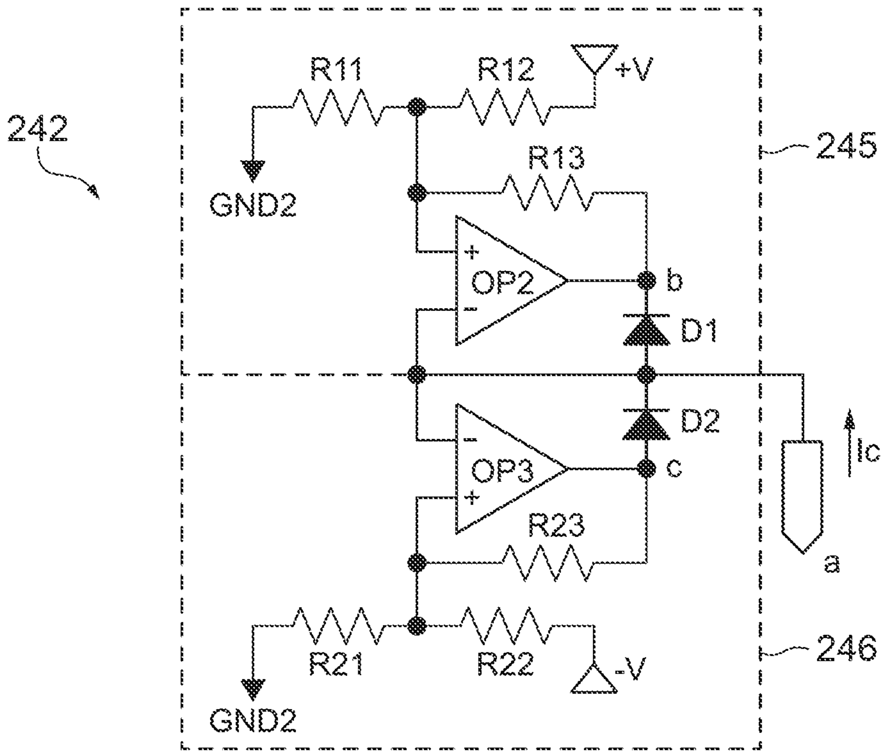
FIG. 2 An exemplary configuration diagram of a charging acceleration unit.

FIG. 2 shows an exemplary configuration of the charging acceleration unit 242. The charging acceleration unit 242 has a hysteresis comparator 245 for a positive power source and a hysteresis comparator 246 for a negative power source. The hysteresis comparator 245 for a positive power source operates when the battery 230 for positive voltage (the battery connected as shown in FIG. 1) is connected and charges the coupling capacitor C3. In contrast, the hysteresis comparator 246 for a negative power source operates when the battery 230 for negative voltage (the battery connected reversely to the case shown in FIG. 1) is connected and charges the coupling capacitor C3.

The hysteresis comparator 245 for a positive power source includes an operational amplifier OP2, a diode D1, and three resistors R11, R12, and R13. An inverting terminal of the operational amplifier OP2 is connected to an output of the charging acceleration unit 242 and an anode of the diode D1. A non-inverting terminal of the operational amplifier OP2 is connected to one end of each of the three resistors R11, R12, and R13. An output terminal of the operational amplifier OP2 is connected to a cathode of the diode D1 and another end of the resistor R13. Another end of the resistor R11 is connected to the ground GND2, and another end of the resistor R12 is connected to a positive power source +V. Hysteresis characteristics of the hysteresis comparator 245 (low voltage-side threshold voltage and high voltage-side threshold voltage) are set depending on the magnitude of the three resistors R11, R12, and R13 and the positive power source +V.

The hysteresis comparator 246 for a negative power source has a configuration symmetrical to the hysteresis comparator 245 for a positive power source. Specifically, the hysteresis comparator 246 for a negative power source includes an operational amplifier OP3, a diode D2, and three resistors R21, R22, and R23. An inverting terminal of the operational amplifier OP3 is connected to the output of the charging acceleration unit 242 and a cathode of the diode D2. A non-inverting terminal of the operational amplifier OP3 is connected to one end of each of the three resistors R21, R22, and R23. An output terminal of the operational amplifier OP3 is connected to an anode of the diode D2 and another end of the resistor R23. Another end of the resistor R21 is connected to the ground GND2, and another end of the resistor R22 is connected to a negative power source −V. Hysteresis characteristics of the hysteresis comparator 246 (low voltage-side threshold voltage and high voltage-side threshold voltage) are set depending on the magnitude of the three resistors R21, R22, and R23, and the negative power source −V.

Description is now given of the operation of the charging acceleration unit 242. Since the hysteresis comparator 245 for a positive power source and the hysteresis comparator 246 for a negative power source charge the coupling capacitor C3 in the same manner except for the polarity and the direction of charge current, the operation of the charging acceleration unit 242 will be described below by taking the operation of the hysteresis comparator 245 for a positive power source as an example.

When the battery 230 is connected to the battery tester 200 with the polarity shown in FIG. 1, the voltage Va at the point a is substantially equal to the voltage of the battery 230 since the coupling capacitor C3 is in an uncharged state. Therefore, the voltage between both the terminals of the current source for disconnection detection 241 is in the state of considerably exceeding the compliance voltage of the current source for disconnection detection 241, which makes it impossible to normally operate the current source for disconnection detection 241. The voltage Va is also applied to the non-inverting terminal of the operational amplifier OP2 in the hysteresis comparator 245 for a positive power source and is compared with the voltage at the inverting terminal, and the voltage Vb at the output terminal (point b) of the operational amplifier OP2 becomes a low voltage (a potential equivalent to the negative-side source voltage −V supplied to the operational amplifier OP2). As a consequence, a charge current Ic flows to the point b from the point a via the diode D1, so that the coupling capacitor C3 is charged. As the voltage between both the terminals of the coupling capacitor C3 increases, the voltage Va between both the terminals of the current source for disconnection detection 241 decreases.

As charging of the coupling capacitor C3 progresses, and the voltage Va becomes a prescribed voltage that is less than the compliance voltage of the current source for disconnection detection 241 (the low voltage-side threshold voltage of the hysteresis comparator 245), the voltage Vb at the output terminal (point b) of the operational amplifier OP2 changes to a high voltage (voltage equivalent to the positive power source +V). Since the cathode side of the diode D1 becomes a high voltage, the charge current Ic is stopped and the operation of the charging acceleration unit 242 is stopped. Since the voltage between both the terminals of the current source for disconnection detection 241 is equal to or less than the compliance voltage, the current source for disconnection detection 241 operates normally, and the normal current Id for disconnection detection is supplied, so that disconnection detection can be performed.

When the charging acceleration unit 242 is provided in this way, it becomes possible to quickly charge the coupling capacitor regardless of the time constant of the coupling capacitor C3 and the resistor R3, and to detect the disconnection detection.

Incidentally, when the supply of the current Id for disconnection detection is started, the voltage Va changes from the voltage of the battery 230 to a voltage that is obtained by superposing a voltage at the completion of charging of the coupling capacitor C3 on a voltage drop component, which is the product of a path impedance of the current path 201 and the current Id for disconnection detection. Since the current Id for disconnection detection is an alternating current, the voltage Va momentarily exceeds the voltage at the completion of charging of the coupling capacitor C3. At the time, if the charging acceleration unit 242 restarts and the charge current Ic flows, part of the current Id for disconnection detection diverges to the charging acceleration unit 242, which prevents accurate disconnection detection. However, since the hysteresis comparator 245 has hysteresis characteristics, the charging acceleration unit 242 is in a high resistance state and does not restart until the voltage Va exceeds the high voltage-side threshold voltage, even when the voltage Va exceeds the low voltage-side threshold voltage. By setting the high voltage-side threshold voltage of the hysteresis comparator 245 to a value equal to or more than a maximum voltage (instantaneous value) at the time of supplying the current Id for disconnection detection, it becomes possible to prevent restart at the time of supplying the current Id for disconnection detection.

In the above example, description has been given of an example of the operation in which a battery 230 is connected as shown in FIG. 1 to charge the coupling capacitor C3 by the operation of the hysteresis comparator 245 for a positive power source. However, in the case where the battery 230 is connected in a reverse direction of FIG. 1, the hysteresis comparator 246 for a negative power source similarly operates to charge the coupling capacitor C3 (provided that the polarity of the voltage and the direction of the charge current Ic are reversed). Due to the operation of the hysteresis comparator 245 for a positive power source and the hysteresis comparator 246 for a negative power source, the charging acceleration unit 242 charges the coupling capacitor when the voltage between both the terminals of the current source for disconnection detection exceeds a prescribed voltage range that is narrower than the compliance voltage of the current source for disconnection detection, and the charging acceleration unit 242 is in a high resistance state with no flow-in/flow-out of current except during charging.

Figure 3A:
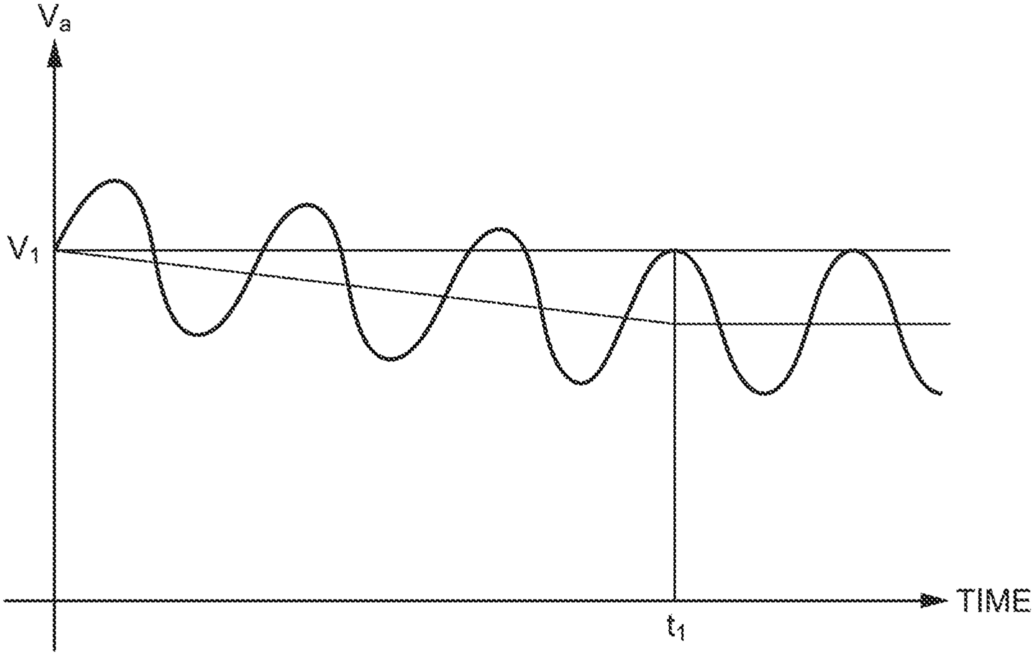
FIG. 3A An explanatory view of hysteresis characteristics.
Figure 3B:
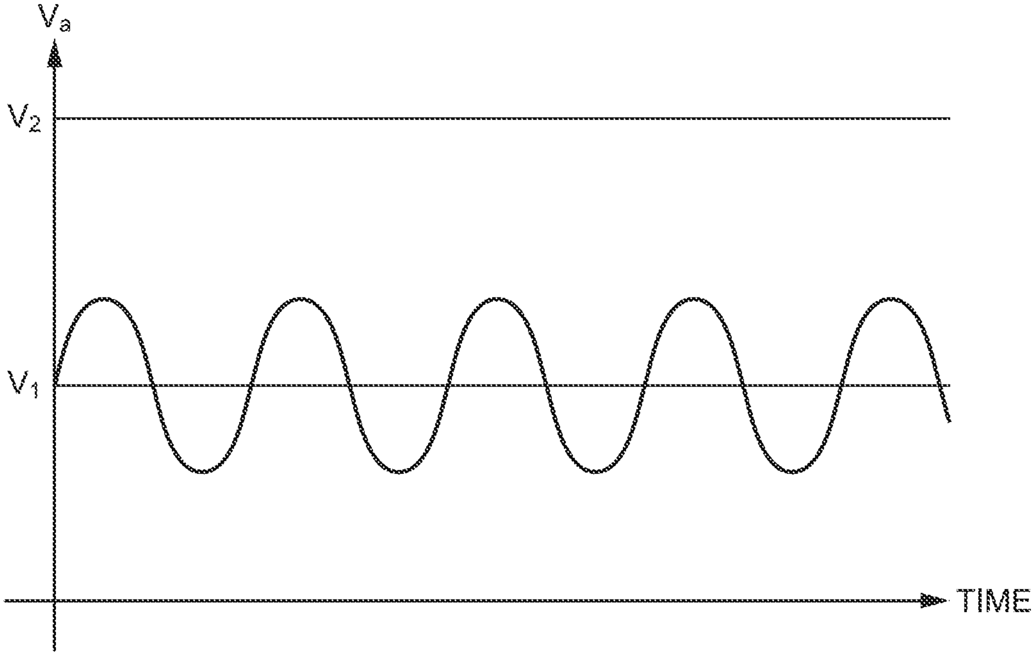
FIG. 3B An explanatory view of hysteresis characteristics.
Figure 4:
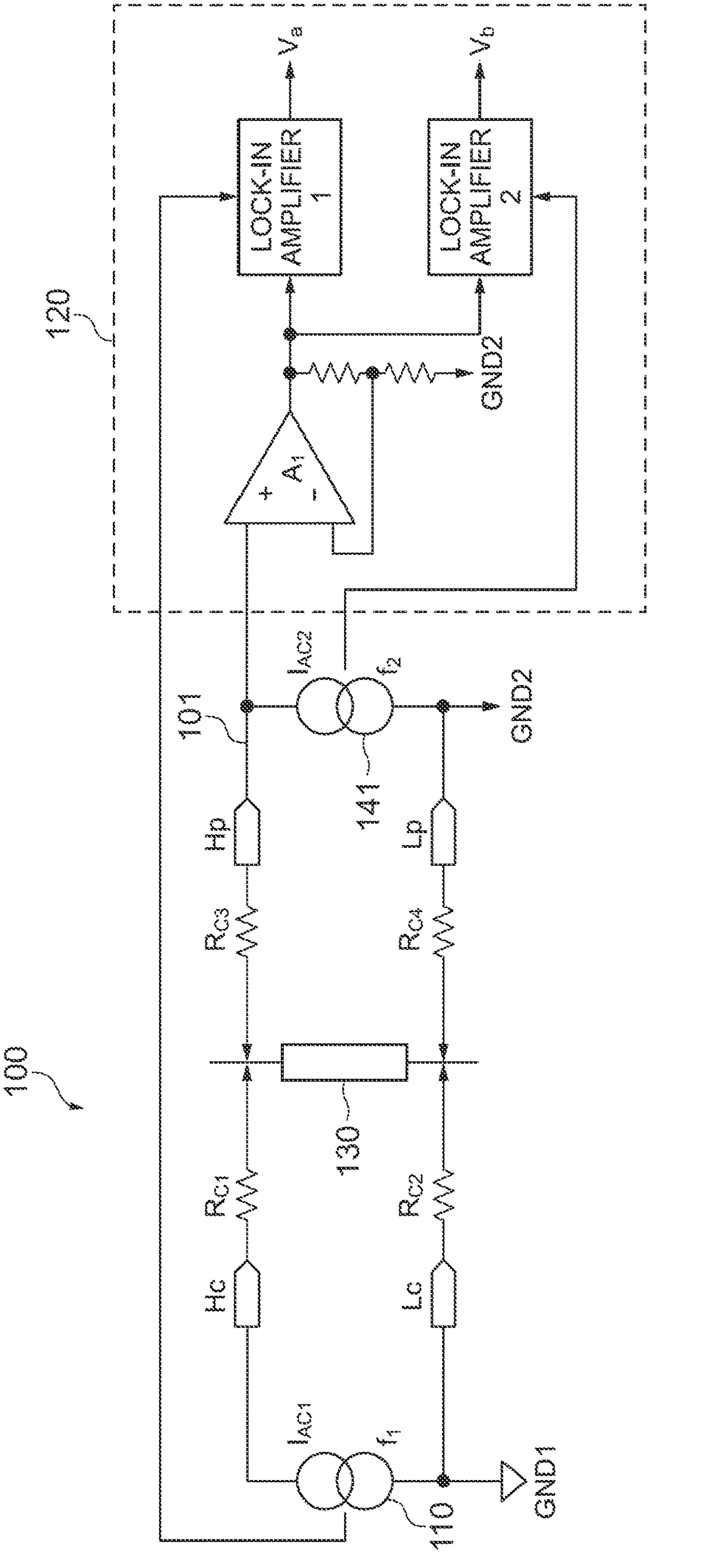
FIG. 4 A diagram showing a conventional example of an impedance measuring device.

The effects of the hysteresis characteristics of the charging acceleration unit 242 is further described using FIG. 3A and FIG. 3B. FIG. 3A and FIG. 3B are voltage waveforms at the point a when the current Id for disconnection detection is supplied, with time as a horizontal axis and voltage as a vertical axis. FIG. 3A is a voltage waveform when the charging acceleration unit 242 does not have hysteresis characteristics, and FIG. 3B is a voltage waveform when the charging acceleration unit 242 has hysteresis characteristics. $V_1$ is a voltage at which the charging acceleration unit 242 stops supplying the charge current Ic, which is the low voltage-side threshold voltage in the charging acceleration unit 242 having the hysteresis characteristics. $V_2$ is the high voltage-side threshold voltage of the charging acceleration unit 242 having the hysteresis characteristics.

When the charging acceleration unit 242 does not have hysteresis characteristics, the charging acceleration unit 242 restarts when Va exceeds $V_1$ with the supply of the current Id for disconnection detection. As a result, the charge current Ic intermittently flows and charges the coupling capacitor C3, so that a direct current component of Va decreases as shown in FIG. 3A. At time $T_1$, the maximum value (instantaneous value) of Va no longer exceeds $V_1$ and the operation of the charging acceleration unit 242 completely stops. Since the voltage between both the terminals of the current source for disconnection detection 241 exceeds the compliance voltage until time $t_1$, the normal operation of the current source for disconnection detection 241 is not guaranteed, and the disconnection detection cannot be performed.

On the contrary, in the case where the charging acceleration unit 242 has the hysteresis characteristics, the charging acceleration unit 242 does not restart and maintains a high resistance state as long as the voltage Va does not exceed $V_2$, even when the voltage Va exceeds $V_1$ due to the supply of the current Id for disconnection detection as shown in FIG. 3B. For this reason, the coupling capacitor C3 is not charged with the current Id for disconnection detection, and immediate detection of disconnection can be performed. Therefore, having hysteresis characteristics allows detection of disconnection in a shorter time by time $t_1$.

Although the present invention made by the inventors have been described concretely based on the embodiment as described above, it is naturally understood that the present invention is not limited thereto, and various modifications are possible without departing from the gist of the present invention. For example, in the above embodiment, the hysteresis comparators for the positive power source and negative power source are adopted as the charging acceleration unit 242, though a programmable current source including a function to monitor the voltage between both the terminals of the current source for disconnection detection and a function of hysteresis characteristics may be used.

LIST OF REFERENCE SIGNS

100 impedance measuring device
101, 201 current path
110, 210 current source for measurement
120, 220 measurement unit
130 measurement target object
141, 241 current sources for disconnection detection
200 impedance measuring device (battery tester)
230 measurement target object (battery)
240 current supply unit for disconnection detection
242 charging acceleration unit
245 hysteresis comparator (positive power source)
246 hysteresis comparator (negative power source)
C1, C2, C3 coupling capacitor
D1, D2 diode
GND1, GND2 ground
Hc, Lc, Hp, Lp contact terminal
OP1, OP2, OP3 operational amplifier
R1, R2, R3, R11, R12, R13, R21, R22, R23 resistor
$R_{Hc}$, $R_{Hp}$, $R_{Lc}$, $R_{Lp}$ contact resistance
Z internal impedance

The invention claimed is:

1. An impedance measuring device, comprising:

a measurement unit that measures a voltage, generated between contact terminals that respectively contact both terminals of a measurement target object by an alternating current supplied to the measurement target object, and determines an internal impedance of the measurement target object;

a current source for disconnection detection that supplies an alternating current for disconnection detection to a current path between the measurement unit and the measurement target object via a coupling capacitor; and a charging acceleration unit, connected between the coupling capacitor and the current source for disconnection detection, monitors the voltage between both terminals of the current source for disconnection detection and charges the coupling capacitor when the voltage between both terminals of the current source for disconnection detection exceeds a prescribed voltage range, wherein the charging acceleration unit is in a high-resistance state upon completion of charging.

2. An impedance measuring device comprising:

a measurement unit that measures a voltage, generated between contact terminals that respectively contact both terminals of a measurement target object by an alternating current supplied to the measurement target object, and determines an internal impedance of the measurement target object;

a current source for disconnection detection that supplies an alternating current for disconnection detection to a current path between the measurement unit and the measurement target object via a coupling capacitor;

a charging acceleration unit, connected between the coupling capacitor and the current source for disconnection detection, that monitors the voltage between both terminals of the current source for disconnection detection and charges the coupling capacitor when the voltage between both terminals of the current source for disconnection detection exceeds a prescribed voltage range and becomes a high-resistance state upon completion of charging;

wherein the prescribed voltage range is narrower than a compliance voltage of the current source for disconnection detection; and wherein the current source for disconnection detection, the charging acceleration unit, and a resistor are connected in parallel to each other with respect to an input.

3. The impedance measuring device according to claim 1, wherein the charging acceleration unit, that has hysteresis characteristics that are set depending on a magnitude of three resistors and a negative power source, does not restart when the voltage between both the terminals exceeds a low voltage-side threshold voltage, and maintains a high-resistance state until the voltage between both the terminals exceeds a high voltage-side threshold voltage.

4. The impedance measuring device according to claim 3, wherein the charging acceleration unit includes a hysteresis comparator for a positive power source and a hysteresis comparator for a negative power source, wherein a high voltage-side threshold voltage of the hysteresis comparators is set to be equal to or more than the maximum voltage, as an instantaneous value, at the time of supplying the current for disconnection detection.

* * * * *